(12) United States Patent
Naritake

(10) Patent No.: US 6,208,563 B1
(45) Date of Patent: Mar. 27, 2001

(54) SEMICONDUCTOR MEMORY DEVICE WHICH CONTINUOUSLY PERFORMS READ/WRITE OPERATIONS WITH SHORT ACCESS TIME

(75) Inventor: Isao Naritake, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/468,294

(22) Filed: Dec. 21, 1999

(30) Foreign Application Priority Data

Dec. 22, 1998 (JP) .................................................. 10-365516

(51) Int. Cl.[7] ...................................................... G11C 7/00
(52) U.S. Cl. ................................ 365/189.05; 365/189.01; 365/189.03; 365/189.04; 365/194; 365/203; 365/233
(58) Field of Search ......................... 365/189.05, 189.01, 365/189.03, 189.04, 194, 203, 233

(56) References Cited

U.S. PATENT DOCUMENTS

| | | | |
|---|---|---|---|
| 5,185,719 | * | 2/1993 | Dhong et al. .................... 365/189.01 |
| 5,749,086 | * | 5/1998 | Ryan .................................... 711/105 |
| 5,815,458 | * | 9/1998 | Chevallier et al. ............. 365/230.06 |
| 6,021,083 | * | 2/2000 | Shiau et al. ...................... 365/230.01 |
| 6,031,785 | * | 2/2000 | Park et al. ....................... 365/230.08 |

* cited by examiner

Primary Examiner—David Nelms
Assistant Examiner—Connie C. Yoha
(74) Attorney, Agent, or Firm—McGuireWoods LLP

(57) ABSTRACT

A semiconductor memory device such as a DRAM device in which, in each write or read cycle, a plurality bits of data are written to or read from memory cells as a burst. The semiconductor memory device includes: a plurality of write/read circuits for reading data from selected memory cells to data lines and writing data from the data lines to selected memory cells; a column selector for distributing data from an input/output line to the data lines, and outputting data from the data lines to the input/output line; and a plurality of data latches inserted into data line circuit portions between the column selector and the write/read circuits, for temporarily storing data to be written to or read from the memory cells as a burst. In a write cycle, after data stored in the latches is written into memory cells and after elapsing a predetermined time period required for a precharge operation of the bit lines, the next write cycle is started. In a read cycle, after data is read out from memory cells into the data latches and after performing a precharge operation of the bit lines, the next read cycle is started.

17 Claims, 12 Drawing Sheets

SEMICONDUCTOR MEMORY DEVICE WHICH CONTINUOUSLY PERFORMS READ/WRITE OPERATIONS WITH SHORT ACCESS TIME

FIELD OF THE INVENTION

The present invention relates generally to a semiconductor memory device, and more particularly to a semiconductor memory device, such as a DRAM (Dynamic Random Access Memory) device, which can perform burst write and/or read operations, which can perform continuous write and/or read operations through a plurality of write or read cycles, and which has short access time in the first write or read cycle.

BACKGROUND OF THE INVENTION

In a DRAM device which performs only burst read/write operation, in a write cycle or a read cycle performed every word line, a plurality bits of data are continuously read from or written to a memory cell array. Such a DRAM device can perform fast read and write operations, and is therefore suitable for a secondary cache memory of a MPU (Micro Processor Unit).

However, in a DRAM device it is necessary to precharge bit lines to a predetermined potential when the write/read cycle is started, because of the structure of the memory cells of the DRAM device. Therefore, it is usually impossible to continuously execute write or read cycles and to perform data input or output continuously over a plurality of write or read cycles. In order to perform continuous data input and/or output, a special device therefore is required.

On the other hand, there is known a SDRAM (Synchronous Dynamic Random Access Memory) device in which high speed data write/read operation can be performed in synchronism with an external control signal. In the SDRAM device, a memory cell array is divided into a plurality of banks, and the write/read operation is performed while switching between the banks. Also, in the banks not selected, the precharge operation is previously performed. Thereby, continuous data write/read operation can be performed.

However, even in the SDRAM device, it is impossible to perform continuous write/read operation within the same bank.

Here, an explanation will be made on the read/write operation within the same bank in the SDRAM device.

FIG. 10 is a block circuit diagram illustrating a schematic electrical structure of a SDRAM device having a memory cell array which comprises a plurality of banks. FIG. 11 is a timing diagram used for explaining a write operation of the SDRAM device of FIG. 10. FIG. 12 is a timing diagram used for explaining read operation of the SDRAM device of FIG. 10.

In the SDRAM device shown in FIG. 10, a memory cell array is divided into a plurality of memory banks, for example, a bank A and a bank B. A chip select signal *CS, a row address strobe signal *RAS, a column address strobe signal *CAS, and a write enable signal *WE supplied from external are decoded in a command decoder 101, and internal control signals for determining operation modes such as write/read operation, refresh operation and the like are produced and supplied to a control logic 102. Here, a symbol * designates logical inversion, and corresponds to an overline used in the drawings. In the control logic 102, timing of the internal control signals from the command decoder 101 is adjusted depending on information on latency of write/read operation and the like supplied from a mode register 103. The internal control signals whose timing is adjusted are supplied to various portions of the SDRAM device.

In response to the internal control signal or signals, a row address buffer and refresh counter block 104 supplies X (row) address for raising a potential of a word line to a row decoder 105. Also, in response to the internal control signal or signals, a column address buffer and burst counter block 106 supplies Y (column) address for raising a potential of bit lines to a column decoder 107. Thereby, in a selected bank A, for example, it becomes possible to perform a data write/read operation. In this case, in the row address buffer and refresh counter block 104, a word line to be refreshed is counted in response to a refresh command. Also, in the column address buffer and burst counter block 106, the number of data bits to be burst read/written is counted.

A sense amplifier block 108 amplifies an output data signal from each memory cell in a read operation to determine logical status of the output data. A data control circuit 109 controls the selection of data bus for the memory cell array and controls the selection of banks, in the write/read operation. A latch circuit 110 temporarily stores an input/output data for delivery thereof with an external circuit in response to an external control signal DQM. An input/output buffer 111 performs delivery of data with the external circuit. A clock generator 112 supplies clock signals for operation to various portions of the SDRAM device.

Operation of the SDRAIM device of FIG. 10 will be described in detail with reference to the drawings.

FIG. 11 shows waveforms of various portions of the SDRAM device of FIG. 10, when write operation is performed. As shown in FIG. 11, when data is written to the bank A, based on an active command supplied to the SDRAM device, a chip select signal *CS and a row address strobe signal *RAS become logically low potential level. Also, based on an address signal A11 among an address signals supplied to the SDRAM device, the bank A is selected. Based on an address signal A10 and based on address signals ADD (i.e., A9–A0), among the address signals supplied to the SDRAM device, X address XA0 is selected.

Then, in response to a write command, the chip select signal *CS and a column address strobe signal *CAS become logically low potential level (i.e., low). Also, based on the address signal A11, the bank A is selected, and, based on the address signals ADD (i.e., A9–A0), Y address YA0 is selected. Further, a write enable signal *WE becomes low and, in response thereto and when a word line WL is activated, data DQ including data D00, D01, D02 and D03 serially supplied is written as a burst to the bank A according to the Y address YA0 in order of D00, D01, D02 and D03.

Before starting the next write operation cycle, in response to a precharge command, the chip select signal *CS and the write enable signal *WE become low. Also, based on the address signal A11, the bank A is selected, and each bit line of the bank A is precharged. When write operation is to be performed continuously, a next X address XA1 is selected based on the address signal A10 and the address signals ADD, and a next Y address YA1 is selected based on the address signals ADD. Then, operation cycles similar to those mentioned above with respect to the X address XA0 and Y address YA0 are repeated.

FIG. 12 shows waveforms of various portions of the SDRAM device of FIG. 10, when read operation is performed. As shown in FIG. 12, when data is to be read from the bank A, based on an active command supplied to the SDRAM device, the chip select signal *CS and the row address strobe signal *RAS become logically low. Also, based on an address signal A11 among an address signals supplied to the SDRAM device, the bank A is selected. Based on an address signal A10 and based on address signals ADD (i.e., A9–A0), among the address signals supplied to the SDRAM device, X address XA0 is selected.

Then, in response to a read command, the chip select signal *CS and the column address strobe signal *CAS become low. Also, based on the address signal A11, the bank A is selected, and, based on the address signals ADD (i.e., A9–A0), Y address YA0 is selected. Further, when a word line WL is activated, data DQ, that is, data D00, D01, D02 and D03, is read out serially as a burst after a delay time of 3 clocks from the bank A according to the Y address YA0 in order of D00, D01, D02 and D03. The delay time of 3 clocks is determined depending on the information on latency supplied from the mode register 103 and corresponds to latency 3.

Before starting the next read operation cycle, in response to a precharge command, the chip select signal *CS and the write enable signal *WE become low. Also, based on the address signal A11, the bank A is selected, and each data line of the bank A is precharged. When read operation is to be performed continuously, a next X address XA1 is selected based on the address signal A10 and the address signals ADD, and a next Y address YA1 is selected based on the address signals ADD. Then, operation cycles similar to those mentioned above with respect to the X address XA0 and Y address YA0 are repeated.

As mentioned above, even in a SDRAM device having a bank structure, it was impossible to continuously perform write or read operation to or from addresses within the same bank, when write or read cycles continue. Similarly, in a DRAM device which does not have a bank structure, it was impossible to continuously perform write or read operation when write or read cycles continue.

If it is possible, in a DRAM device or in the same bank of a SDRAM device, to continuously perform write or read operation when write or read cycles continue, ability of a memory device can be enhanced and operation speed thereof can be greatly improved. However, such continuous write or read operation was impossible in a conventional DRAM device.

SUMMARY OF THE INVENTION

Therefore, it is an object of the present invention to obviate the disadvantages of the conventional DRAM device.

It is another object of the present invention to provide a DRAM device in which continuous write or read operation can be performed when write or read cycles continue.

It is still another object of the present invention to provide a DRAM device in which continuous write or read operation can be performed when write or read cycles continue, even if the DRAM device does not have a bank structure.

It is still another object of the present invention to provide a DRAM device in which continuous write or read operation can be performed when write or read cycles continue and which has short access time in the first write or read cycle.

According to a first aspect of the present invention, there is provided a semiconductor memory device in which a word line is selected based on a row address, and a bit line is selected based on a column address, and in which, in each write or read cycle, a plurality bits of data are written to or read from memory cells as a burst, the semiconductor memory device comprising: a plurality of write/read circuits for reading data from selected memory cells to data lines and writing data from the data lines to selected memory cells; a column selector for distributing data from an input/output line to the data lines, and outputting data from the data lines to the input/output line; a plurality of data latches inserted into data line circuit portions between the column selector and the write/read circuits, for temporarily storing data to be written to or read from the memory cells as a burst; and wherein, in a write cycle, after data stored in the latches is written into memory cells and after elapsing a predetermined time period required for a precharge operation of the bit lines, the next write cycle is started, and, in a read cycle, after data is read out from memory cells into the data latches and after performing a precharge operation of the bit lines, the next read cycle is started.

According to a second aspect of the present invention, there is provided a semiconductor memory device in which a word line is selected based on a row address, and a bit line is selected based on a column address, and in which, in each write or read cycle, a plurality of data bits are written to or read from memory cells corresponding to a selected word line as a burst, the semiconductor memory device comprising: a plurality of write/read circuits for reading data from selected memory cells to the lines and writing data from the data lines to the memory cells; a column selector for distributing data from an input/output line to the data lines, and outputting data from the data lines to the input/output line; a plurality of data latches inserted into data line circuit portions between the column selector and the write/read circuits, for temporarily storing data to be written to or read from the memory cells as a burst; and a word line drive signal generating circuit which supplies a word line drive signal to the word line, and in which, in a write cycle, the word line drive signal is deactivated after a predetermined delay time corresponding to a time period required for finishing write operation of data stored in the latches from activation of a write/read operation start signal, and the word line drive signal is activated after a predetermined delay time required for the precharge of the bit lines from the time the word line signal is deactivated, and, in a read cycle, after a predetermined delay time from activation of a word line in response to the activation of a write/read operation start signal, the word line drive signal is deactivated and a precharge operation of the bit lines is performed.

It is preferable that, in the word line drive signal generating circuit, a write end signal is generated after a predetermined delay time corresponding to a time until the end of write operation of data to the data latch in response to the generation of the write/read operation start signal, and a read end signal is generated after a predetermined delay time corresponding to a time until the end of read operation of data from the latch in response to the generation of a word line activation signal, and wherein, in a write mode, a word line activation signal is activated after a predetermined delay time corresponding to a sum of a time until the end of write operation of data stored in the latch from the generation of the write/read operation start signal and a time required for the precharge of bit lines, and, in a read mode, the word line activation signal is activated in response to the generation of the write/read operation start signal and the word line activation signal is deactivated when the write end signal or the read end signal is generated.

It is also preferable that, in the word line drive signal generating circuit, in the last write cycle, the write end signal is generated after a predetermined delay time corresponding to a time until the end of data write operation to the data latch, in response to the end of the write mode.

Further, it is preferable that, in the word line drive signal generating circuit, the word line activation signal is activated after a predetermined delay time from the generation of the write/read operation start signal.

It is advantageous that each of the write/read circuits is coupled to and corresponds to a pair of bit lines.

It is also advantageous that a plurality of the write/read circuits are coupled to a pair of data lines.

Further, it is advantageous that a data amplifier is coupled to a pair of the data lines, and each of the data latches is coupled between the data amplifier and the column selector.

It is also advantageous that each of the write/read circuits comprises a sense amplifier, a read switch circuit portion for transferring data from a pair of bit lines to a pair of data lines, a write switch circuit portion for transferring data from a pair of data lines to a pair of bit lines, and a precharge circuit portion for precharging a pair of bit lines.

According to a third aspect of the present invention, there is provided a semiconductor memory device in which a word line is selected based on a row address, and a bit line is selected based on a column address, and in which, in each write or read cycle, a plurality of data bits are written to or read from memory cells corresponding to a selected word line as a burst, the semiconductor memory device comprising: a plurality of write/read circuits for reading data from the memory cells to the data lines and writing data from the data lines to the memory cells; a column selector for distributing data from an input/output line to the data lines, and outputting data from the data lines to the input/output line; a plurality of data latches inserted between the column selector and the write/read circuits, for temporarily storing data to be written to or read from the memory cells as a burst; and a word line drive signal generating circuit which, when write cycles or read cycles continue, after a word line drive signal is deactivated in response to the generation of a write end signal or read end signal, the word line drive signal is activated after a predetermined delay time corresponding to a time period required for the precharge of bit lines, and, in the first write or read cycle, the word line drive signal is activated immediately after the generation of the write/read operation start signal.

In this case, it is preferable that, in the word line drive signal generating circuit, a write end signal is generated after a predetermined delay time corresponding to a time until the end of write operation of data to the data latch in response to the generation of the write/read operation start signal, and a read end signal is generated after a predetermined delay time corresponding to a time until the end of read operation of data from the latch in response to the generation of a word line activation signal, and wherein, the word line activation signal is activated in response to the generation of the write/read operation start signal, and, the word line activation signal is deactivated in response to the generation of the write end signal or the read end signal, and wherein the word line activation signal is activated again after a predetermined delay time corresponding to a time period required for the precharge of bit lines form the time the word line activation signal is deactivated.

It is also preferable that, in the word line drive signal generating circuit, in the last write cycle, the write end signal is generated after a predetermined delay time corresponding to a time until the end of data write operation to the data latch, in response to the end of the write mode.

It is advantageous that each of the write/read circuits is coupled to and corresponds to a pair of bit lines.

It is also advantageous that a plurality of the write/read circuits are coupled to a pair of data lines.

It is further advantaeous that a data amplifier is coupled to a pair of the data lines, and each of the data latches is coupled between the data amplifier and the column selector.

Further, it is advantageous that each of the write/read circuits comprises a sense amplifier, a read switch circuit portion for transferring data from a pair of bit lines to a pair of data lines, a write switch circuit portion for transferring data from a pair of data lines to a pair of bit lines, and a precharge circuit portion for precharging a pair of bit lines.

In the semiconductor memory device according to the first and second aspects of the present invention, in a write cycle, after data stored in the data latches is written into memory cells and after elapsing of a time needed for precharge operation therefrom, the next write cycle begins. In a read cycle, data is read out from memory cells into the data latches and then, after performing precharge operation, the next read cycle begins. Therefore, it is possible to continuously perform write or read operation when write or read cycles continue.

Similarly, in the semiconductor memory device according to the third aspect of the present invention, in a write cycle, after data stored in the data latches is written into memory cells and after elapsing of a time needed for precharge operation therefrom, the next write cycle begins. In a read cycle, data is read out from memory cells into the data latches and then, after performing precharge operation, the next read cycle begins. Therefore, it is possible to continuously perform write or read operation when write or read cycles continue.

Also, in this case, in a first write or read cycle, in response to the generation of a write or read operation start signal, potential of a word line activation signal is immediately raised to activate a word line. Therefore, an access time of write or read operation in a first write or read cycle can be shortened.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the attached drawings, embodiments of the present invention will be now described in detail.

Embodiment 1

Figure 1:
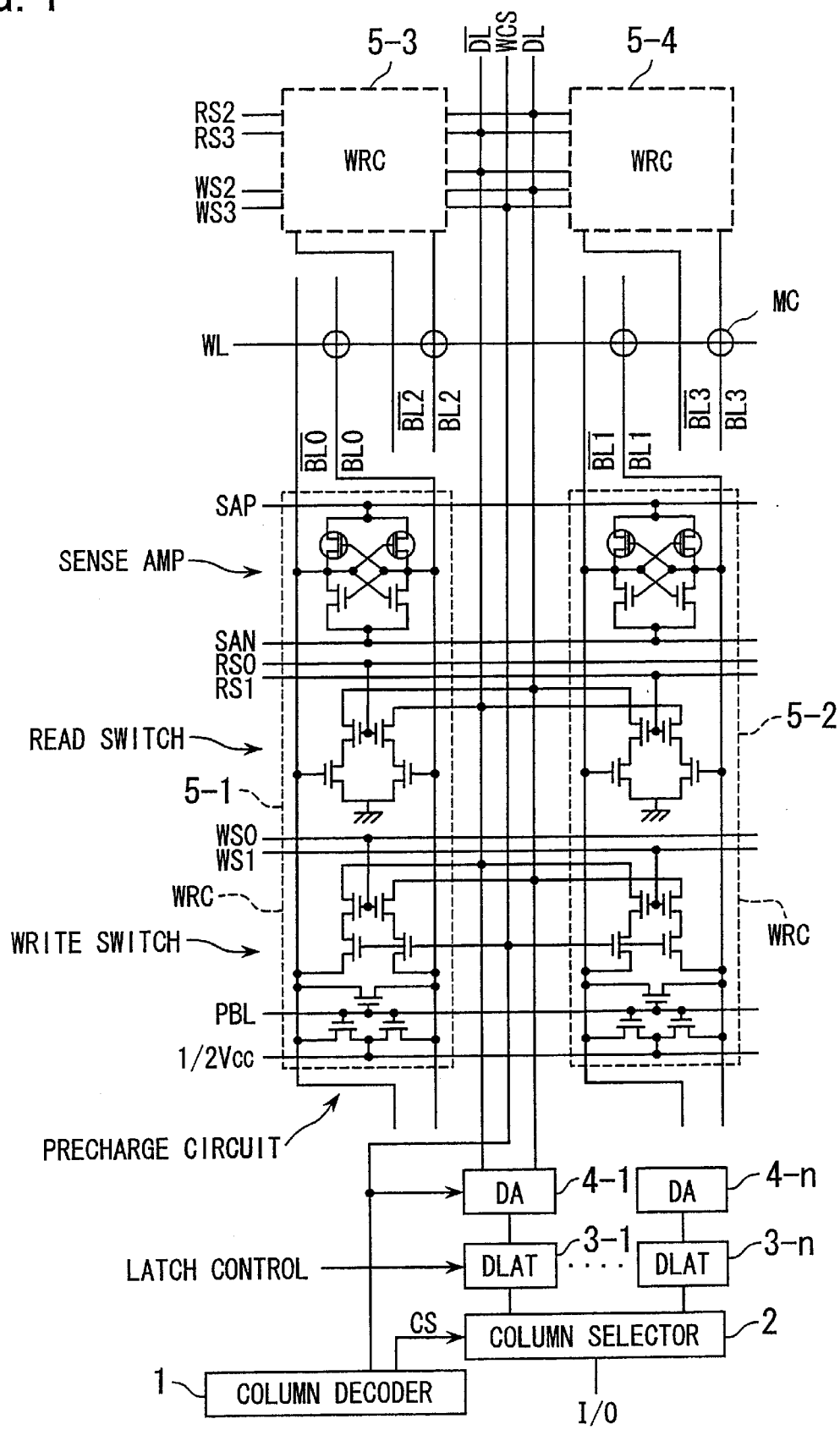
FIG. 1 is a partial block circuit diagram showing an electrical structure of a semiconductor memory device according to a first embodiment of the present invention.
Figure 2A:
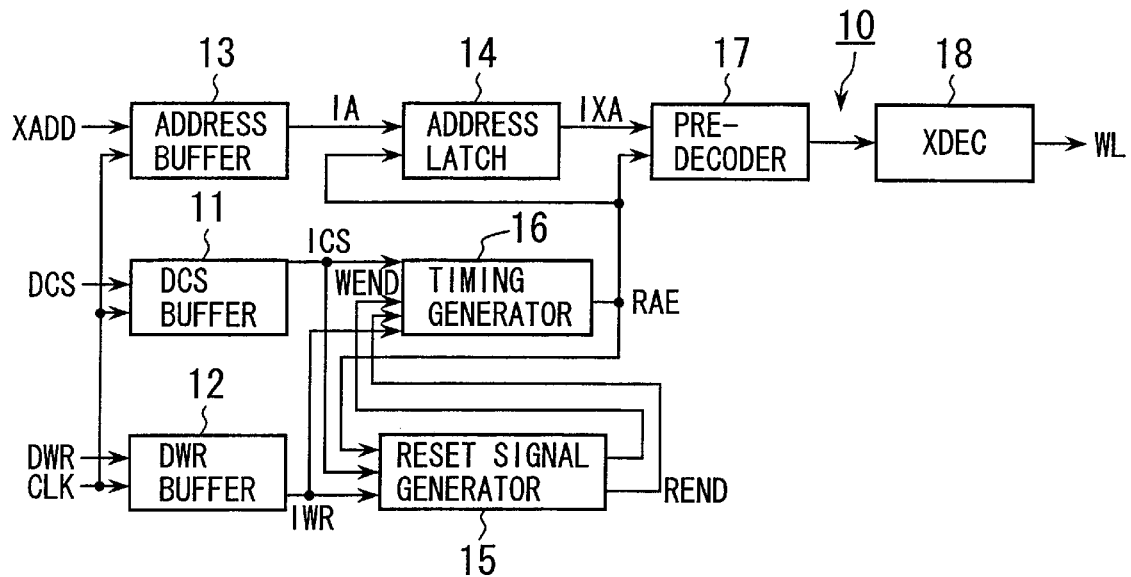
FIG. 2A is a block circuit diagram showing an electrical structure of a word line drive signal generating circuit used in the semiconductor memory device of FIG. 1.
Figure 2B:
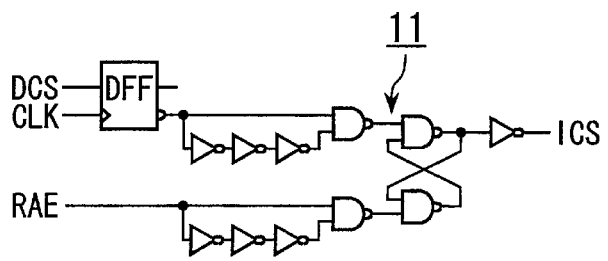
FIG. 2B is a block circuit diagram showing an electrical structure of a DCS buffer circuit used in the word line drive signal generating circuit of FIG. 2A.
Figure 2C:
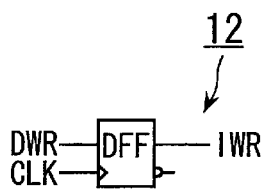
FIG. 2C is a block circuit diagram showing an electrical structure of a DWR buffer circuit used in the word line drive signal generating circuit of FIG. 2A.
Figure 2D:
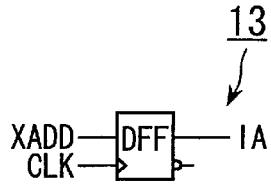
FIG. 2D is a block circuit diagram showing an electrical structure of an address buffer circuit used in the word line drive signal generating circuit of FIG. 2A.
Figure 3A:
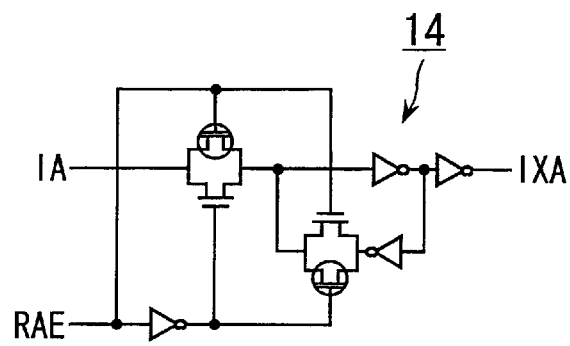
FIG. 3A is a block circuit diagram showing an electrical structure of an address latch circuit used in the word line drive signal generating circuit of FIG. 2A.
Figure 3B:
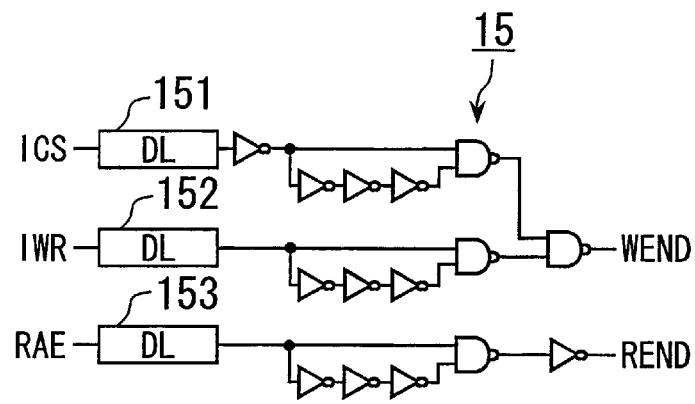
FIG. 3B is a block circuit diagram showing an electrical structure of a reset signal generator circuit used in the word line drive signal generating circuit of FIG. 2A.
Figure 3C:
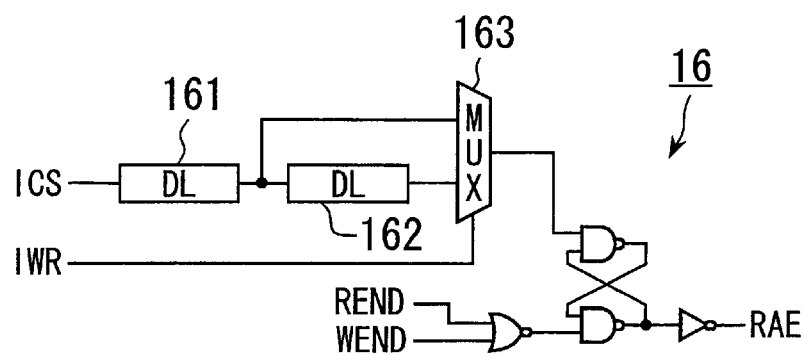
FIG. 3C is a block circuit diagram showing an electrical structure of a timing generator circuit used in the word line drive signal generating circuit of FIG. 2A.
Figure 4:
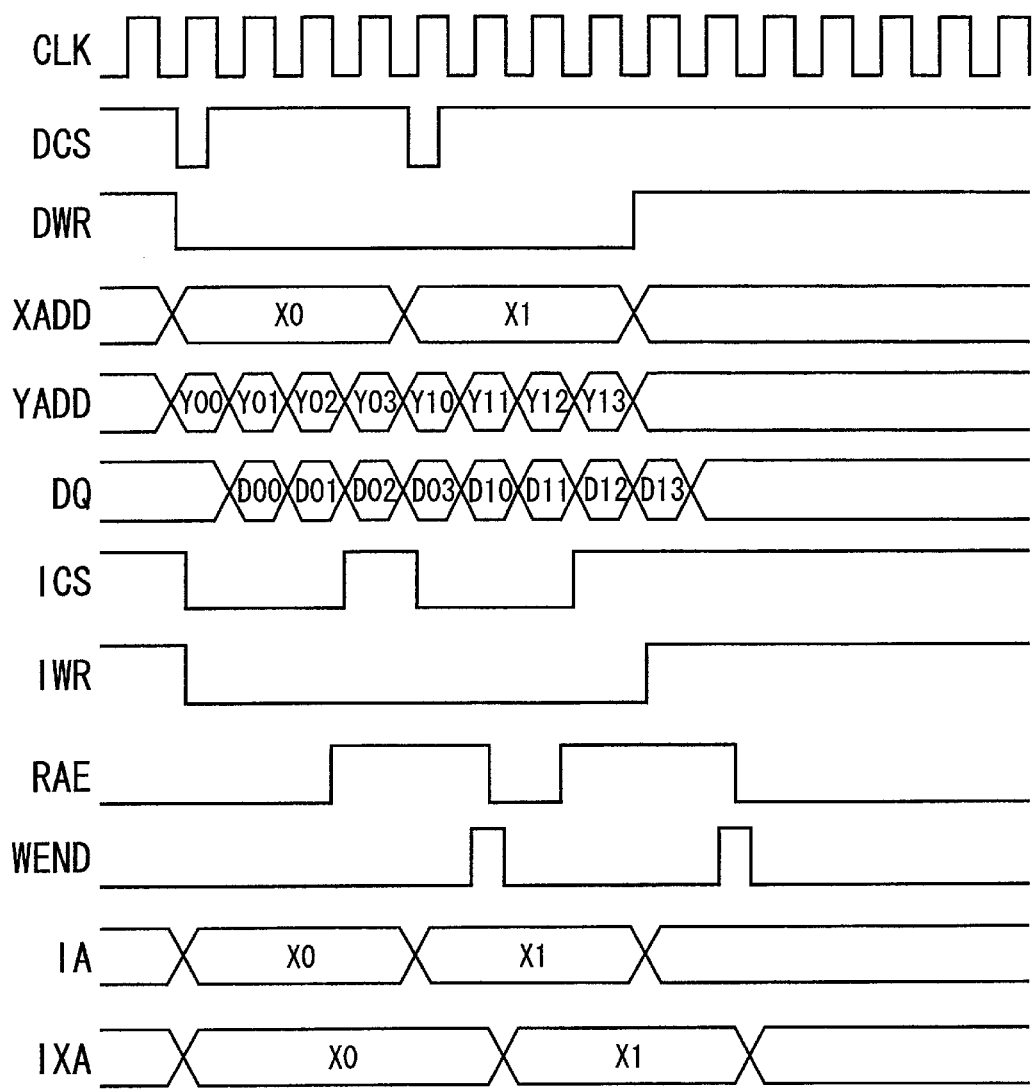
FIG. 4 is a timing diagram including signal waveforms of various portions of the semiconductor memory device shown in FIG. 1, FIGS. 2A through 2D and FIGS. 3A through 3C, when write operation is performed.
Figure 5:
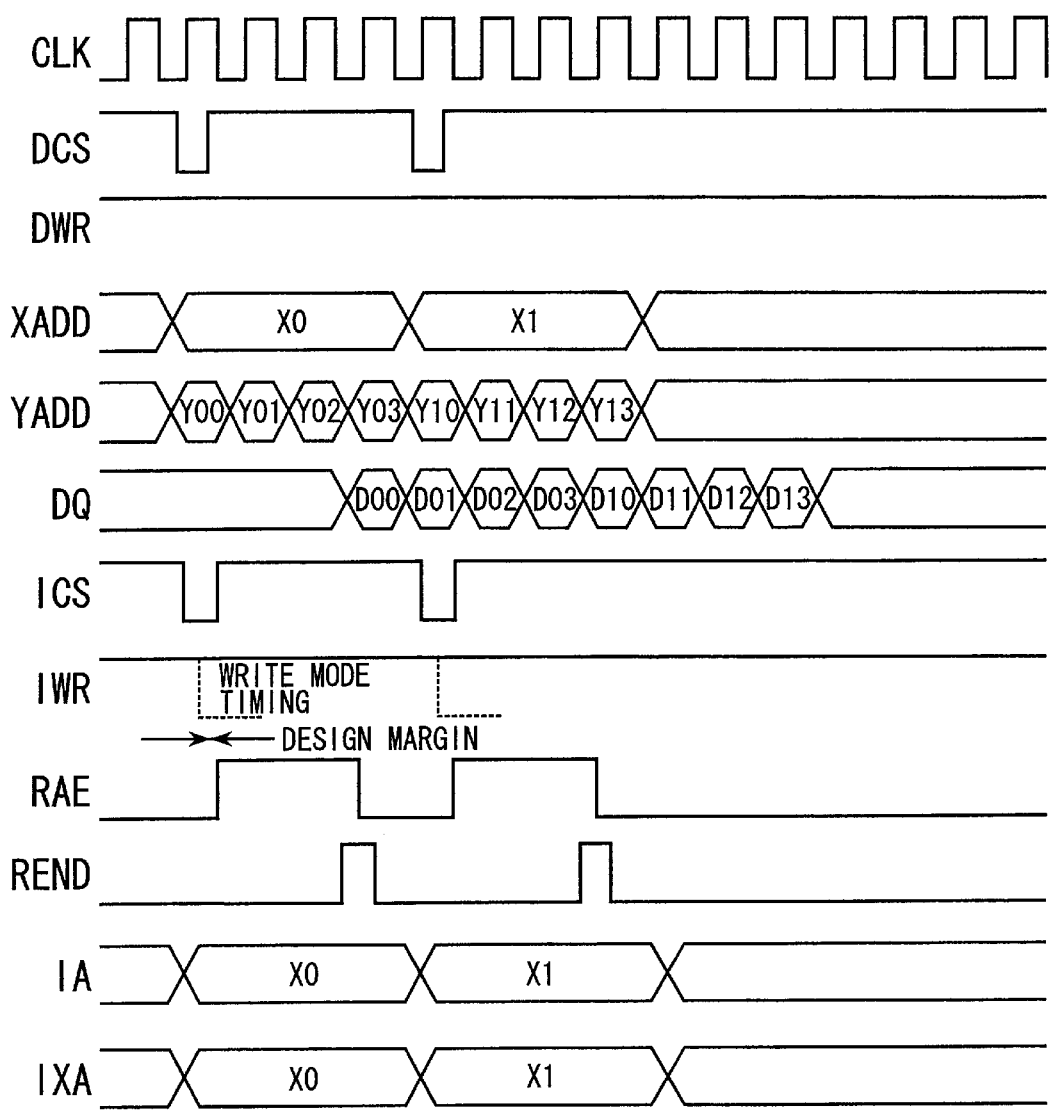
FIG. 5 is a timing diagram including signal waveforms of various portions of the semiconductor memory device shown in FIG. 1, FIGS. 2A through 2D and FIGS. 3A through 3C, when read operation is performed.

FIG. 1 partially illustrates a semiconductor memory device according to a first embodiment of the present invention. FIG. 2A illustrates an electrical structure of a word line drive signal generating circuit used in the semiconductor memory device of FIG. 1. FIGS. 2B through 2D and FIGS. 3A through 3C illustrate electrical structures of circuit components used in the word line drive signal generating circuit of FIG. 2A. FIG. 4 is a timing diagram including signal waveforms of various portions of the semiconductor memory device according to the first embodiment, when write operation is performed. FIG. 5 is a timing diagram including signal waveforms of various portions of the semiconductor memory device according to the first embodiment, when read operation is performed.

As shown in FIG. 1, the semiconductor device according to the first embodiment generally comprises: a column decoder 1; a column selector 2; data latches (DLAT's) 3-1, . . . , 3-n; data amplifiers (DA's) 4-1, . . . , 4-n; and write/read circuits (WRC's) 5-1, . . . , 5-4, . . . .

FIG. 1 shows only portions relevant to the present invention. Also, in the circuit of FIG. 1, circuit structure of each of the WRC's 5-1 and 5-2 is shown in detail. Circuit structure of other write/read circuits (WRC's) 5-3, 5-4 and the like is the same as that of the WRC 5-1 or WRC 5-2. The WRC 5-1 and WRC 5-2 are coupled to the DLAT 3-1 and DA 4-1, which are selected among DLAT's 3-1, . . . , 3-n and DA's 4-1, . . . , 4-n by the column selector 2. Although not shown in the drawing, it is also possible to provide a plurality of column selectors, such as the column selector 2.

The write/read circuit, for example, WRC 5-1 comprises a sense amplifier portion, a read switch portion, a write switch portion and a precharge circuit portion which are coupled between a pair of bit lines *BL0 and BL0. The write/read circuits WRC 5-1, WRC 5-2, WRC 5-3, WRC 5-4 are coupled to a pair of data lines *DL and DL.

The semiconductor memory device comprises a memory cell array not shown in the drawing which may be the same as that of a conventional DRAM device. The memory cell array comprises, for example, a plurality of memory cells disposed in a matrix. For example, each of the memory cells is a one transistor and one capacitor type memory cell, and is connected between one of a plurality of word lines and one of a plurality of bit lines. In FIG. 1, such memory cell is designated by a reference symbol MC, and is connected between a word line WL and each of the bit lines BL0, BL1, . . . , BL3. Other portions of the semiconductor memory device not shown in FIG. 1, such as a row decoder, a row address buffer, a column address buffer and the like may be the same as those used in a conventional DRAM device. Here, a symbol * designates logical inversion, and corresponds to an overline used in the drawings.

It is also possible that word lines WL have a hierarchical structure and are composed, for example, of main word lines and a plurality of sub-word lines corresponding to each of the main word lines. However, in this embodiment, it is assumed that word lines do not have a hierarchical structure, for the sake of easy understanding.

In FIG. 1, the column decoder 1 receives a column address signal not shown in the drawing and outputs a column select signal CS for controlling selecting operation of the column selector 2, and a write column select signal WCS for controlling selection of the write/read circuits (WRC's) 5-1, . . . , 5-4, . . . . The column selector 2 selects one of a plurality of data latches 3-1, . . . , 3-n and couples the selected data latch with an input/output line (I/O), in response to the column select signal CS. The data latches 3-1, . . . , 3-n temporarily store write or read data under the control of a latch control signal. The data amplifiers (DA's) 4-1, . . . , 4-n amplify the write data from or the read data to the corresponding data latches 3-1, . . . , 3-n.

When selected by the write column select signal WCS, each of the write/read circuits (WRC's) 5-1, . . . , 5-4 performs data write or data read operation between memory cells and each of the bit lines *BL0, BL0, *BL1, BL1, ..., *BL3, BL3 coupled to the corresponding write/read circuit (WRC). Each of the write/read circuits (VRC's) 5-1, ..., 5-4 also performs precharge operation to the corresponding bit line pair (*BL, BL). Precharge of data line pair (*DL, DL) can be done, for example, by a precharge circuit (not shown in the drawing) included in a data amplifier DA.

With reference to FIG. 1, operation of the semiconductor memory device according to the first embodiment will now be described.

When data is to be written to or read from each of the memory cells corresponding to the write/read circuit, for example, 5-1, a word line WL is selected by applying a word line drive signal produced by a word line drive signal generating circuit based on an X address. Also, a Y address of a selected column is supplied the column decoder 1. The column decoder 1 generates a corresponding column select signal CS and a corresponding write column select signal WCS. In response to the column select signal CS, the column selector 2 selects one of the data latches 3-1, ..., 3-n for temporarily storing writ data or read data. Also, in response to the write column select signal WCS, one of the data amplifiers 4-1, ..., 4-n corresponding to the selected data latch becomes active, that is, becomes an operating condition.

When data is to be written to a memory cell coupled to the write/read circuit 5-1, data inputted from the input/output line I/O is supplied to the data latch 3-1 via the column selector 2 and is temporarily stored in the data latch 3-1. The data from the data latch 3-1 is amplified in the data amplifier 4-1 and outputted to the data lines *DL and DL, and, in response to the write column select signal WCS, a write switch portion of the write/read circuit 5-1 is activated. In this condition, a write switch signal WS0 becomes logically high potential level and, in response thereto, the data line DL is coupled to the bit line BL0, and the data line *DL is coupled to the bit line *BL0, thereby data is written to the memory cell. When a write switch signal WS1 becomes high, the data line DL is coupled to the bit line BL1, and the data line *DL is coupled to the bit line *BL1.

On the other hand, when data is to be read out from a memory cell coupled to the write/read circuit 5-1, a signal read out from the memory cell to a bit line BL0 or *BL0 is input to the sense amplifier portion of the write/read circuit 5-1. The sense amplifier portion operates on a P channel power source SAP and an N channel power source SAN, and amplifies a minute voltage between the bit lines BL0 and *BL0. In this condition, when a read switch signal RS0 becomes high, one of the data lines *DL or DL is grounded depending on which of the bit lines BL0 or *BL0 is in a high potential level. The potential Vcc/2 of the data line not grounded and the ground potential of the grounded data line are delivered to the data amplifier 4-1. The data amplifier 4-1 outputs a logical signal determined by the potential Vcc/2 of the data line not grounded and the ground potential of the grounded data line to the data latch 3-1. The data latch temporarily stores the logical signal, and outputs it from the input/output line I/O via the column selector 2.

When the bit lines BL and *BL are to be precharged, a precharge bit line signal PBL is rendered logically high. Thereby, the bit lines BL0 and *BL0 are electrically short-circuited and a potential of Vcc/2 is applied to both the bit lines, so that these bit lines BL0 and *BL0 are precharged.

FIG. 2A is a block diagram showing a structure of a word line drive signal generating circuit 10 which provides a word line drive signal to a word line WL when selected. The word line drive signal generating circuit 10 comprises a DCS buffer 11, a DWR buffer 12, an address buffer 13, an address latch 14, a reset signal generating circuit 15, a timing generating circuit 16, a predecoder 17, and a X decoder (XDEC) 18. FIG. 2B shows a detailed structure of the DCS buffer 11. FIG. 2C shows a detailed structure of the DWR buffer 12. FIG. 2D shows a detailed structure of the address buffer 13. FIG. 3A shows a detailed structure of the address latch 14. FIG. 3B shows a detailed structure of the reset signal generating circuit 15. FIG. 3C shows a detailed structure of the timing generating circuit 16.

The DCS buffer 11 shown in FIG. 2B detects a fall of an external control signal DCS for instructing a start of a write/read operation, in response to a clock signal CLK, and raises a write/read operation start signal ICS which is an internal control signal. The DCS buffer 11 also raises the ICS signal in response to a rise of a word line activation signal RAE for indicating activation of a word line. In FIG. 2A, an input of the RAE signal into the DCS buffer is not shown for the sake of simplicity of the drawing.

The DWR buffer 12, in response to the clock signal CLK, detects a rise of an external control signal DWR which determines a write/read mode, and renders a write/read mode signal IWR signal, which is an internal control signal corresponding the DWR signal, low in a write mode and high in a read mode.

The address buffer 13 detects, in response to the clock signal CLK, an external address signal XADD, and produces an internal address signal IA corresponding to the external address signal XADD.

The address latch 14 holds the internal address signal IA previously inputted when the RAE signal is high, and outputs the held signal as an internal X address signal IXA. When the RAE signal becomes low, the address latch 14 erases the held address, and when the RAE signal again becomes high, the address latch 14 holds the next internal address IA and outputs as a new internal X address IXA.

The reset signal generating circuit 15 as also shown in FIG. 3B delays the ICS signal by a delay circuit 151 and produces a first internal signal having a predetermined pulse width, i.e., a first one-shot signal. The reset signal generating circuit 15 also delays the IWR signal by a delay circuit 152 and produces a second internal signal having a predetermined pulse width, i.e., a second one-shot signal. The first internal signal and the second internal signal are logically OR operated to generate a write end signal WEND indicating the end of write operation. The reset signal generating circuit 15 further delays the RAE signal by a delay circuit 153 and produces a read end signal REND having a predetermined pulse width via a one-shot circuit coupled to the output of the delay circuit 153. The read end signal REND indicates the end of read operation.

As shown in FIG. 3C, the timing generating circuit 16 switches a multiplexer 163 in response to the IWR signal. Thereby, when the IWR signal is logically high, that is, in a read state, a signal obtained by delaying the ICS signal by a delay circuit 161 is selected and latched. The latched signal is inverted and outputted as the RAE signal having a high logical level, that is, the RAE signal is raised. When the IWR signal is logically low, that is, in a write state, a signal obtained by delaying the ICS signal by the delay circuit 161 and a delay circuit 162 is selected and latched. The latched signal is inverted and outputted as the RAE signal having a high logical level, that is, the RAE signal is raised. Also, in response to the generation of the write end signal WEND or the read end signal REND, the latching operation is released, and the RAE signal is lowered.

The pre-decoder 17 makes the internal address signal IXA effective in response to the generation of the RAE signal. Also, the X decoder (XDEC) 18 produces a word line drive signal WL in response to receiving the effective internal address signal IXA from the pre-decoder 17. Here, the reference symbol WL is used to designate both the word line and the word line drive signal.

With reference to FIGS. 2A through 2D and FIGS. 3A through 3C, operation of the word line drive signal generating circuit 10 in this embodiment will now be described.

In the write cycle, in the DWR buffer 12, the DWR signal is logically low, and the write/read mode signal IWR is logically low. In the DCS buffer 11, a fall of the DCS signal is detected and the write/read operation start signal ICS is lowered. In the timing generation circuit 16, the word line activation signal RAE is raised after a time delay, determined by the delay circuit 161 and the delay circuit 162, from the fall of the ICS signal. The time delay in this case is a time period corresponding to the sum of a time period from the generation of the ICS signal to the end of write operation of data held in the data latch and a time period required for the precharge of bit lines. Since the ICS signal is generated before the IWR signal, the delay circuit 161 delays the ICS signal and prevents the multiplexer 163 from erroneously selecting input signals. The delay time of the delay circuit 161 is determined taking a design margin and the like into consideration.

On the other hand, in the address buffer 13, the internal address IA is generated in response to the generation of the external address XADD. Also, in the address latch 14, in response to the generation of the RAE signal, the address IA is latched and the internal X address IXA is generated. Based on the internal X address IXA, the word line drive signal WL is outputted via the pre-decoder 17 and XDEC 18.

Also, in response to the rise of the RAE signal, the ICS signal from the DCS buffer 11 rises. In the reset signal generating circuit 15, the write end signal WEND is generated after a delay time determined by the delay circuit 151 from the fall of the ICS signal. In response to the generation of the WEND signal, the RAE signal from the timing generating circuit 16 falls. The delay time in this case is determined as a time period from the time the ICS signal falls to the time the word line signal is lowered after the data from the data latches are written into memory cells.

In the last write cycle, in the reset signal generating circuit 15, the write end signal WEND is generated after a delay time determined by the delay circuit 152 from the rise of the write/read mode signal IWR. In response to the generation of the WEND signal, the RAE signal from the timing generating circuit 16 falls. The delay time in this case is determined as a time period from the time the IWR signal rises to the time the word line signal is lowered after the data from the data latches are written into memory cells.

In the read cycle, in the DWR buffer 12, the DWR signal is logically high, and the write/read mode signal IWR is logically high. In the DCS buffer 11, a fall of the DCS signal is detected and the write/read operation start signal ICS is lowered. In the timing generation circuit 16, the word line activation signal RAE is raised after a time delay, determined by the delay circuit 161, from the fall of the ICS signal. In this case, the RAE signal rises after a time period corresponding to the design margin determined by the delay circuit 161, from the fall of the IWR signal in the write operation.

In the reset signal generating circuit 15, the read end signal REND is generated after a delay time determined by the delay circuit 153 from the rise of the RAE signal. In response to the generation of the REND signal, the RAE signal from the timing generating circuit 16 falls. The delay time in this case is determined as a time period from the time the RAE signal rises to the time the word line signal is lowered after the data is read out from memory cells to the data latches.

Now, with reference to FIG. 1, FIGS. 2A through 2D, FIGS. 3A through 3C, and FIG. 4, an explanation will be made on a write operation of the semiconductor memory device according to the first embodiment.

As an example, assume that two write cycles are continuously performed according to the present invention. In the first write cycle, as an X address, i.e., a row address, an external address XADD corresponding to X0 is provided to the memory device, and, as Y addresses, i.e., column addresses, external addresses YADD corresponding to addresses Y00, Y01, Y02 and Y03 are sequentially provided to the memory device.

In the word line drive signal generating circuit 10, the external control signal DWR, that is, a data write command signal, supplied from an external control portion not shown in the drawing becomes low, indicating write operation. Therefore, the write/read mode signal IWR outputted from the DWR buffer 12 becomes logically low and indicates write operation. In this condition, the DCS buffer 11 outputs the write/read start signal ICS (or internal chip select signal) based on the external control signal DCS (or chip select signal), and supplies the ICS signal to the timing generating circuit 16. In the timing generating circuit 16, the multiplexer 163 selects the write/read start signal ICS via the delay circuit 161 and the delay circuit 162, based on the IWR signal having low logical level. Thereby, from the fall of the ICS signal, after a time period corresponding to a time period until write operation of data held in the data latches is finished, the potential of the word line is lowered and further the precharge of bit lines is finished, the word line activation signal RAE is raised.

Thereby, in response to the rise of the RAE signal, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X0.

On the other hand, corresponding to the column addresses Y00, Y01, Y02 and Y03, the column decoder 1 activates the column selector 2, data amplifiers (DA's) 4-1, . . . , and the write column select signal WCS. The column selector 2 selects data latches 3-1, . . . , in response to the column select signal CS supplied from the column decoder 1 and connects to the column input/output line (I/O). Also, data D00, D01, D02, D03 for the first write cycle sequentially input via the I/O line is latched parallel in the latches selected by the column selector 2. Then, the data stored in the latches is written into corresponding memory cells via the data amplifiers and via the write/read circuits 5-1, . . . corresponding to the Y addresses Y00, Y01, Y02, Y03.

In response to the fall of the external control signal DCS (or the chip select signal), the write/read operation start signal ICS (or internal chip select signal) falls, and thereby the write end signal WEND is generated. In response to the generation of the write end signal WEND, in the timing generating circuit 16, the word line activation signal RAE (or row address enable signal) becomes low and thereby the potential of the word line WL is lowered. From the time the signal RAE becomes low and the word line potential becomes low to the time the RAE signal again becomes high, the precharge bit line signal PBL is activated and precharge of the bit lines BL and *BL is performed. Also, the data lines DL and *DL are precharged by the data amplifiers DA. Because of such precharge operation of the bit lines and the data lines, it becomes possible to begin the next write cycle quickly.

In the next write cycle, as an X address, i.e., a row address, an external address XADD corresponding to X1 is provided to the memory device, and, as Y addresses, i.e., column addresses, external addresses YADD corresponding to addresses Y10, Y11, Y12 and Y13 are sequentially provided to the memory device.

The RAE signal again rises and, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X1.

On the other hand, corresponding to the column addresses Y01, Y11, Y12 and Y13, the column decoder 1 activates the column selector 2, data amplifiers (DA's) 4-1, . . . , and the write column select signal WCS. The column selector 2 selects data latches 3-1, . . . , in response to the column select signal CS supplied from the column decoder 1 and connects to the column input/output line (I/O). Also, data D10, D11, D12, D13 for the next write cycle sequentially inputted via the I/O line is latched parallel in the latches selected by the column selector 2. Then, the data stored in the latches is written into corresponding memory cells via the data amplifiers and via the write/read circuits 5-1, . . . corresponding to the Y addresses Y10, Y11, Y12, Y13.

At the end of the write cycle, the DWR signal (or data write command signal) becomes high. In the word line drive signal generating circuit 10, the write/read mode signal IWR becomes high and the reset signal generating circuit 15 generates the WEND signal indicating the end of write operation. Thereby, the RAE signal from the timing generating circuit 16 becomes low, and the potential of the word line is lowered so that the write operation finishes.

Next, with reference to FIG. 1, FIGS. 2A through 2D, FIGS. 3A through 3C, and FIG. 5, an explanation will be made on a read operation of the semiconductor memory device according to this embodiment.

As an example, assume that two read cycles are continuously performed according to the present invention. In the first read cycle, as an X address, i.e., a row address, an external address XADD corresponding to X0 is provided to the memory device, and, as Y addresses, i.e., column addresses, external addresses YADD corresponding to addresses Y00, Y01, Y02 and Y03 are sequentially provided to the memory device.

In the word line drive signal generating circuit 10, the external control signal DWR, that is, a data write command signal, supplied from an external control portion not shown in the drawing is in a logically high potential level, indicating read operation. Therefore, the write/read mode signal IWR outputted from the DWR buffer 12 becomes logically high and indicates read operation. In this condition, the DCS buffer 11 outputs the write/read start signal ICS (or internal chip select signal) having low potential level based on the external control signal DCS (or chip select signal) which indicates start of the write/read operation. The ICS signal is supplied to the timing generating circuit 16. In the timing generating circuit 16, the multiplexer 163 selects the write/read start signal ICS via the delay circuit 161, based on the IWR signal having high logical level. Thereby, in response to the fall of the ICS signal, the word line activation signal RAE is raised.

In response to the rise of the RAE signal, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X0.

On the other hand, corresponding to the column addresses Y00, Y01, Y02 and Y03, the column decoder 1 activates the column selector 2 and data amplifiers (DA's) 4-1, . . . . Also, data D00, D01, D02, D03 for the first read cycle read out from the corresponding memory cells are latched parallel in the latches selected by the column selector 2, via the write/read circuits 5-1, . . . and via the data amplifiers corresponding to the Y addresses Y00, Y01, Y02, Y03. The data stored in the latches are sequentially outputted to the input/output (I/O) line as the data DQ, via the column selector 2, after clock cycles corresponding to a predetermined latency.

At the same time, in the reset signal generating circuit 15 of the word line drive signal generating circuit 10, after a predetermined time period determined by the delay circuit 153 from the rise of the RAE signal, the read end signal REND is generated. In response to the generation of the read end signal REND, in the timing generating circuit 16, the RAE signal becomes low and thereby the potential of the word line WL is lowered. From the time the signal RAE becomes low and the word line potential becomes low to the time the RAE signal again becomes high, the precharge bit line signal PBL shown in FIG. 1 is activated and precharge of the bit lines BL and *BL is performed. Also, the data lines DL and *DL are precharged by the data amplifiers DA. Because of such precharge operation of the bit lines and the data lines, it becomes possible to begin the next read cycle quickly.

In the next read cycle, as an X address, i.e., a row address, an external address XADD corresponding to X1 is provided to the memory device, and, as Y addresses, i.e., column addresses, external addresses YADD corresponding to addresses Y10, Y11, Y12 and Y13 are provided to the memory device.

The RAE signal again rises and, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X1.

On the other hand, corresponding to the column addresses Y10, Y11, Y12 and Y13, the column decoder 1 activates the column selector 2 and data amplifiers (DA) 4-1, . . . , Also, data D10, D11, D12, D13 for the next read cycle read out from the corresponding memory cells are latched parallel in the latches selected by the column selector 2, via the write/read circuits 5-1, . . . and via the data amplifiers corresponding to the Y addresses Y10, Y11, Y12, Y13. The data stored in the latches are sequentially outputted to the input/output (I/O) line as the data DQ, via the column selector 2, after clock cycles corresponding to a predetermined latency. Also, after the signal RAE becomes low, the bit lines BL and *BL and the data lines DL and *DL are precharged in a manner similar to the first read cycle.

As mentioned above, in the semiconductor memory device according to the first embodiment, in a write mode, after a time required for the precharge operation has elapsed from the time when data stored in the data latches is written into memory cells, the next write cycle begins. Also, in a read mode, after data is read out into the data latches and precharge operation is performed, the next read cycle begins. Therefore, when write cycles or read cycles continue, it is possible to continuously perform write or read operation.

Embodiment 2

Figure 6A:
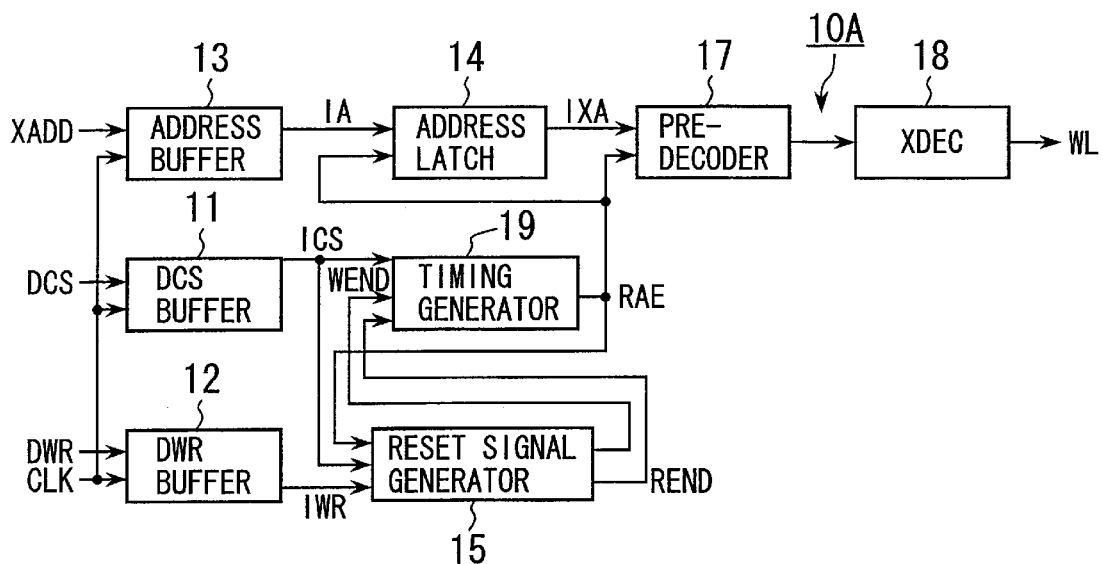
FIG. 6A is a block circuit diagram showing an electrical structure of a word line drive signal generating circuit used in a semiconductor memory device according to a second embodiment of the present invention.
Figure 6B:
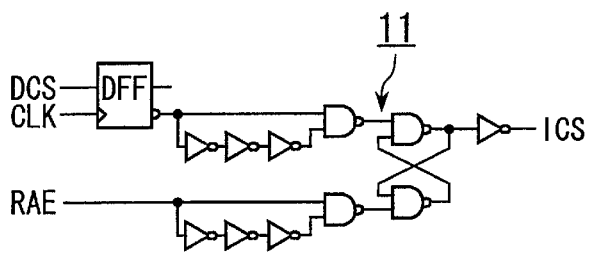
FIG. 6B is a block circuit diagram showing an electrical structure of a DCS buffer circuit used in the word line drive signal generating circuit of FIG. 6A.
Figure 6C:
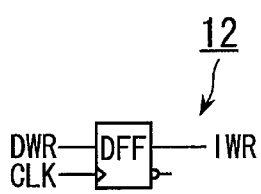
FIG. 6C is a block circuit diagram showing an electrical structure of a DWR buffer circuit used in the word line drive signal generating circuit of FIG. 6A.
Figure 6D:
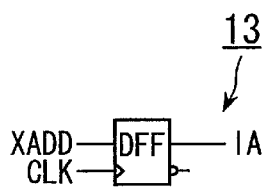
FIG. 6D is a block circuit diagram showing an electrical structure of an address buffer circuit used in the word line drive signal generating circuit of FIG. 6A.
Figure 7A:
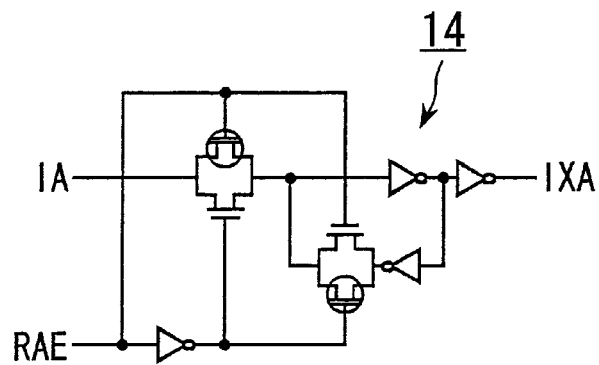
FIG. 7A is a block circuit diagram showing an electrical structure of an address latch circuit used in the word line drive signal generating circuit of FIG. 6A.
Figure 7B:
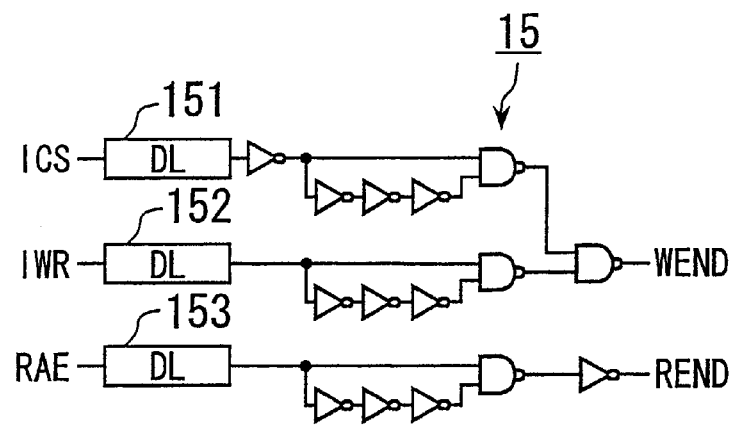
FIG. 7B is a block circuit diagram showing an electrical structure of a reset signal generator circuit used in the word line drive signal generating circuit of FIG. 6A.
Figure 7C:
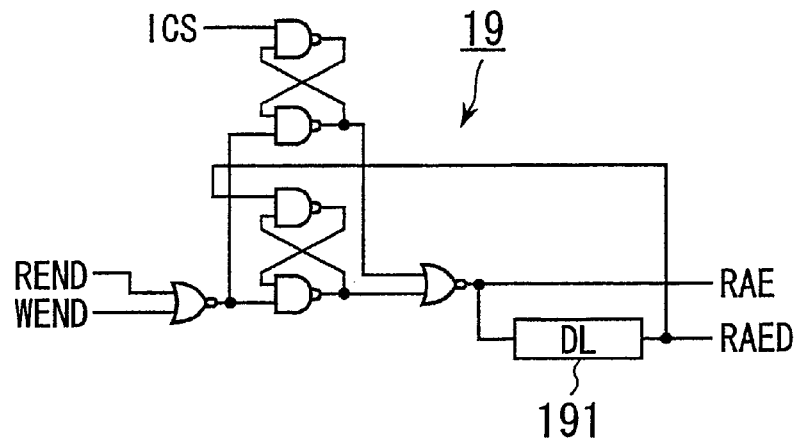
FIG. 7C is a block circuit diagram showing an electrical structure of a timing generator circuit used in the word line drive signal generating circuit of FIG. 6A.
Figure 8:
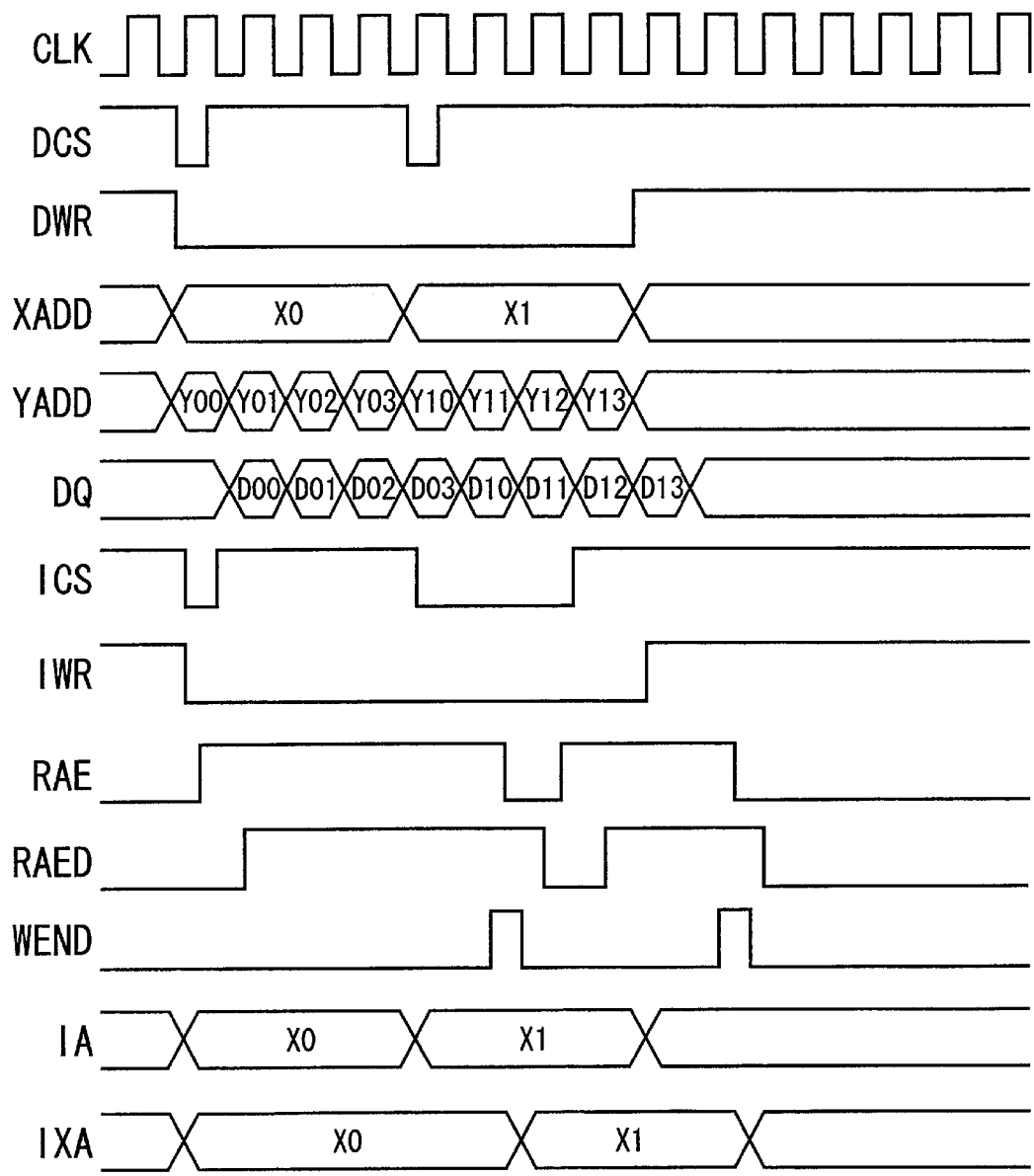
FIG. 8 is a timing diagram including signal waveforms of various portions of the semiconductor memory device according to the second embodiment of the present invention, when write operation is performed.
Figure 9:
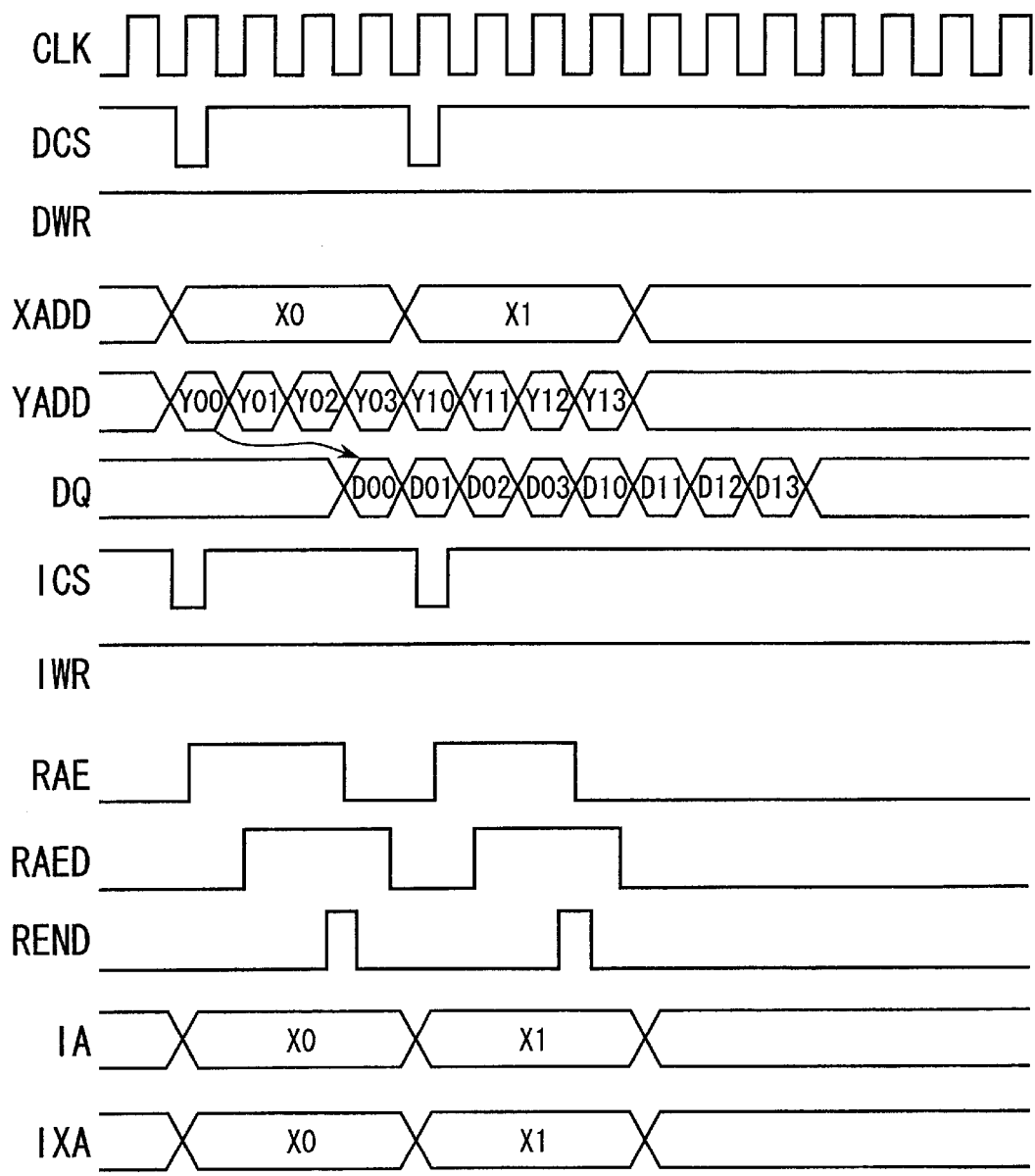
FIG. 9 is a timing diagram including signal waveforms of various portions of the semiconductor memory device according to the second embodiment of the present invention, when read operation is performed.
Figure 10:
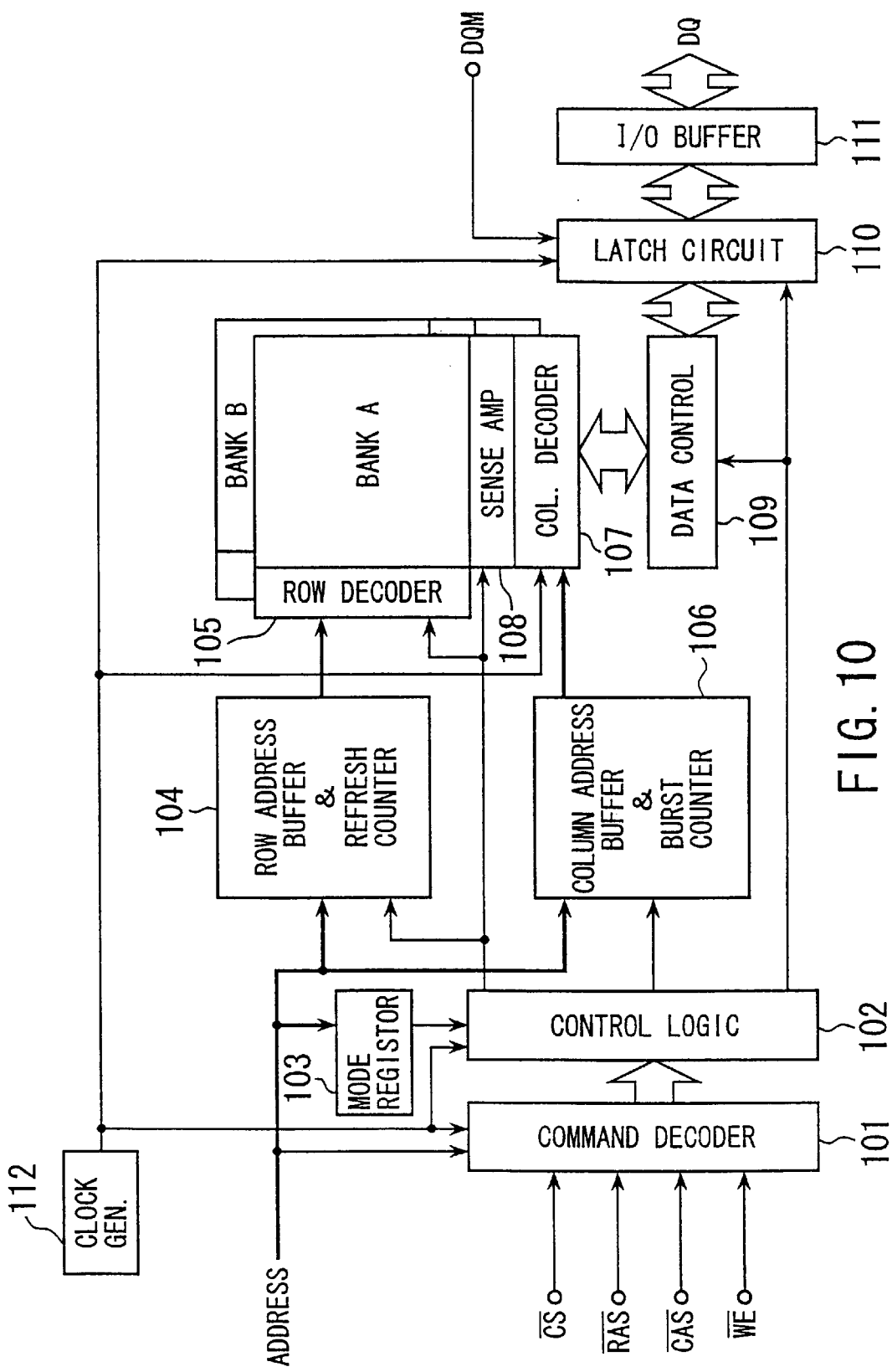
FIG. 10 is a block circuit diagram showing an electrical structure of a conventional SDRAM device having a plurality of memory cell banks.
Figure 11:
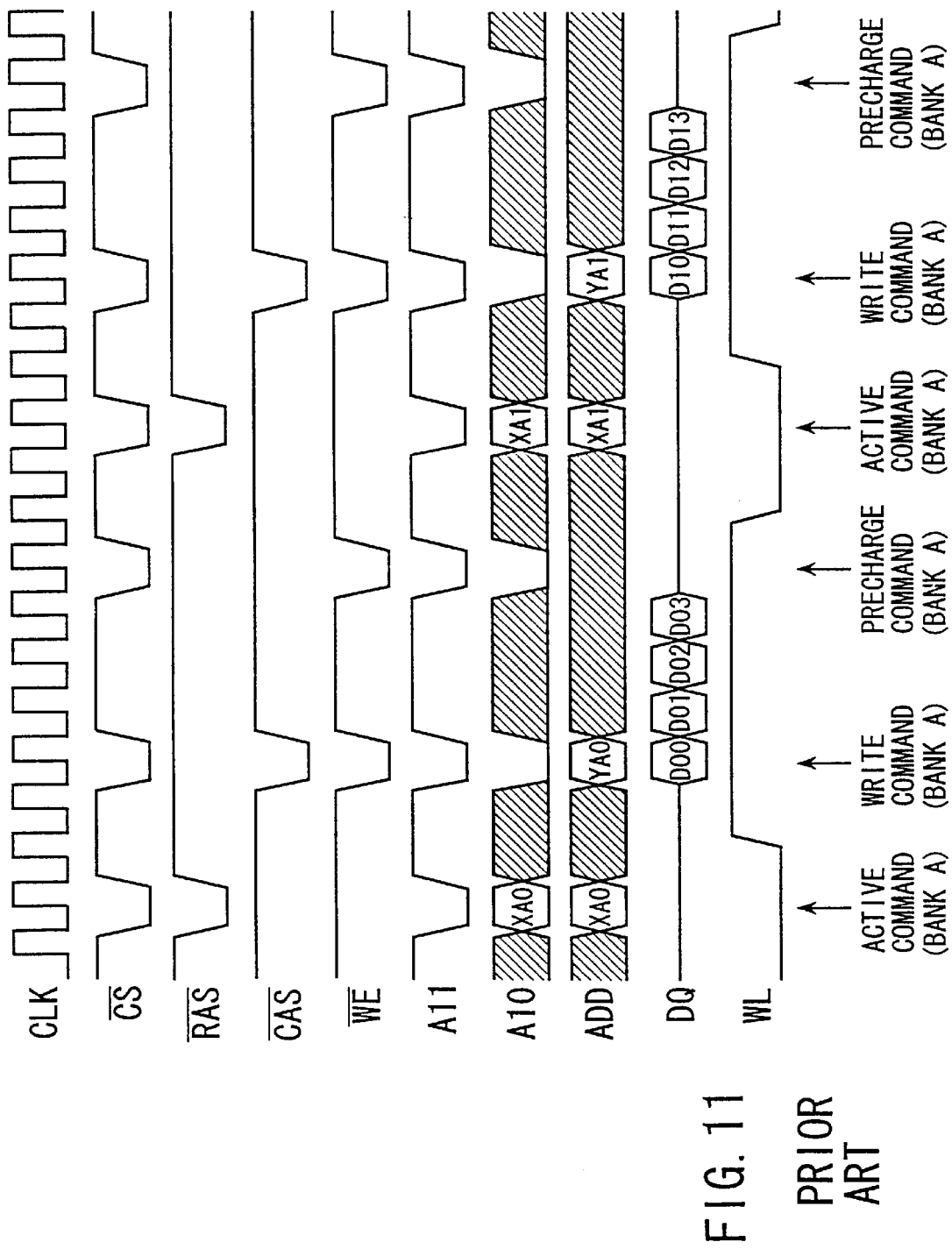
FIG. 11 is a timing diagram including signal waveforms of various portions of the conventional SDRAM device shown in FIG. 10, when write operation is performed.
Figure 12:
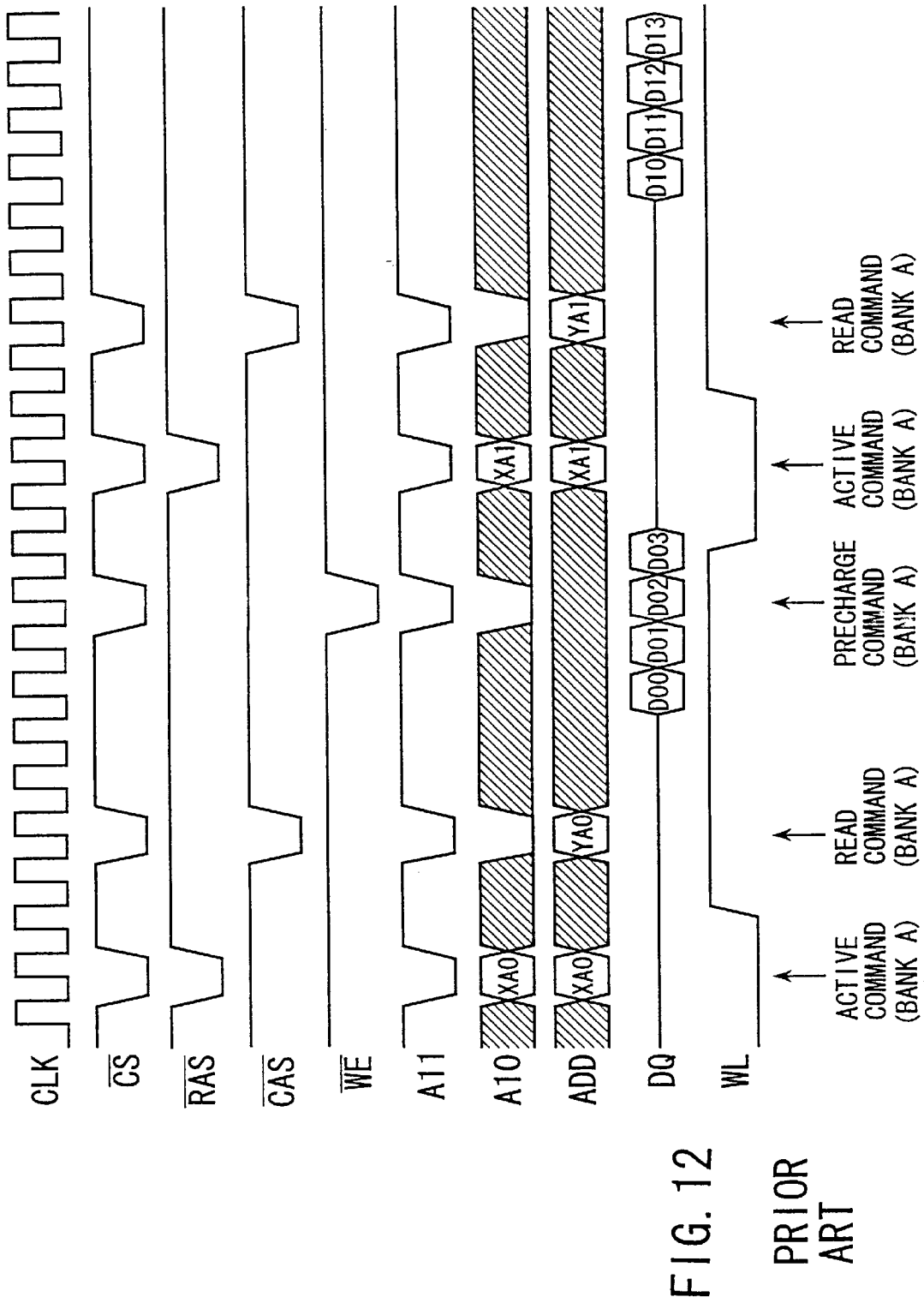
FIG. 12 is a timing diagram including signal waveforms of various portions of the conventional SDRAM device shown in FIG. 10, when read operation is performed.

FIG. 6A illustrates an electrical structure of a word line drive signal generating circuit used in a semiconductor memory device according to a second embodiment of the present invention. FIGS. 6B through 6D and FIGS. 7A through 7C illustrate electrical structures of circuit components used in the word line drive signal generating circuit of FIG. 6A. FIG. 8 is a timing diagram including signal waveforms of various portions of the semiconductor memory device according to the second embodiment, when write operation is performed. FIG. 9 is a timing diagram including signal waveforms of various portions of the semiconductor memory device according to the second embodiment, when read operation is performed. It should be noted that the structure of FIG. 1 is also applicable to the semiconductor memory device according to the second embodiment.

FIG. 6A is a block diagram showing a structure of a word line drive signal generating circuit 10A which provides a word line drive signal to a word line WL when selected. The word line drive signal generating circuit 10A comprises a DCS buffer 11, a DWR buffer 12, an address buffer 13, an address latch 14, a reset signal generating circuit 15, a predecoder 17, a X decoder (XDEC) 18, and a timing generating circuit 19. FIG. 6B shows a detailed structure of the DCS buffer 11. FIG. 6C shows a detailed structure of the DWR buffer 12. FIG. 6D shows a detailed structure of the address buffer 13. FIG. 7A shows a detailed structure of the address latch 14. FIG. 7B shows a detailed structure of the reset signal generating circuit 15. FIG. 7C shows a detailed structure of the timing generating circuit 19.

The DCS buffer 11, a DWR buffer 12, an address buffer 13, an address latch 14, a reset signal generating circuit 15, a predecoder 17, a X decoder (XDEC) 18 shown in FIG. 6B, FIG. 6C, FIG. 6D, FIG. 7A, and FIG. 7B, respectively, are the same as those shown in FIG. 2B, FIG. 2C, FIG. 2D, FIG. 3A, and FIG. 3B, respectively, in the first embodiment. Only the timing generating circuit 19 is different from the timing generating circuit 16 in the first embodiment.

As shown in FIG. 7C, in the timing generating circuit 19, the RAE signal becomes high when the ICS signal is generated, i.e., the ICS signal becomes low. Also, in response to the generation of the WEND signal or the REND signal from the reset signal generating circuit 15, the RAE signal becomes low. Further, after a predetermined time period from the fall of the RAE signal, the RAED becomes low. Also, in response to the fall of the RAED signal, the RAE signal is raised, i.e., becomes high.

With reference to FIGS. 6A through 6D and FIGS. 7A through 7C, operation of the word line drive signal generating circuit 10A in this embodiment will be described.

In the write cycle, in the DWR buffer 12, the DWR signal is logically low, and the write/read mode signal IWR is logically low. In the DCS buffer 11, a fall of the DCS signal is detected and the write/read operation start signal ICS is lowered. In the timing generation circuit 19, the word line activation signal RAE is raised in response to the fall of the ICS signal. After a time delay determined by the delay circuit 191 from the rise of the RAE signal, the RAED signal is raised. The time delay in this case is a time period required for the precharge of bit lines.

On the other hand, in the address buffer 13, the internal address IA is generated in response to the generation of the external address XADD. Also, in the address latch 14, in response to the generation of the RAE signal, the address IA is latched and the internal X address IXA is generated. Based on the internal X address IXA, the word line drive signal WL is outputted via the pre-decoder 17 and XDEC 18.

Also, in response to the rise of the RAE signal, the ICS signal from the DCS buffer 11 rises. In the reset signal generating circuit 15, the write end signal WEND is generated after a delay time determined by the delay circuit 151 from the fall of the ICS signal. In response to the generation of the WEND signal, the RAE signal from the timing generating circuit 19 falls. The delay time in this case is determined as a time period from the time the ICS signal falls to the time the word line drive signal is lowered after the data from the data latches is written into memory cells.

In the last write cycle, in the reset signal generating circuit 15, the write end signal WEND is generated after a delay time determined by the delay circuit 152 from the rise of the write/read mode signal IWR. In response to the generation of the WEND signal, the RAE signal from the timing generating circuit 19 falls. The delay time in this case is determined as a time period from the time the IWR signal rises to the time the word line drive signal is lowered after the data from the data latches is written into memory cells.

In the read cycle, in the DWR buffer 12, the DWR signal is logically high, and the write/read mode signal IWR is logically high. In the DCS buffer 11, a fall of the DCS signal is detected and the write/read operation start signal ICS is lowered. In the timing generation circuit 19, the word line activation signal RAE is raised in response to the fall of the ICS signal. Also, the RAED signal rises after a time period determined by the delay circuit 191, from the rise of the RAE signal.

In the reset signal generating circuit 15, the read end signal REND is generated after a delay time determined by the delay circuit 153 from the rise of the RAE signal. In response to the generation of the REND signal, the RAE signal from the timing generating circuit 19 falls. The delay time in this case is determined as a time period from the time the RAE signal rises to the time the data is read out from a memory cell to the data latch. Also, the RAED signal falls after a time period determined by the delay circuit 191, from the fall of the RAE signal.

With reference to FIG. 1, FIGS. 6A through 6D, FIGS. 7A through 7C, and FIG. 8, an explanation will be made on write operation of the semiconductor memory device according to the second embodiment.

As an example, assume that two write cycles are continuously performed according to the present invention. In the first write cycle, as an X address, i.e., a row address, an external address XADD corresponding to X0 is provided to the memory device, and, as Y addresses, i.e., column addresses, external addresses YADD corresponding to addresses Y00, Y01, Y02 and Y03 are provided to the memory device.

In the word line drive signal generating circuit 10A, the external control signal DWR, that is, a data write command signal, supplied from an external control portion not shown in the drawing becomes low, indicating write operation. Therefore, the write/read mode signal IWR outputted from the DWR buffer 12 becomes logically low and indicates write operation. In this condition, the DCS buffer 11 outputs the write/read start signal ICS (or internal chip select signal) having logically low level based on the external control signal DCS (or chip select signal), and supplies the ICS signal to the timing generating circuit 19. In response to the fall of the ICS signal, the timing generating circuit 19 raises the potential of the word line activation signal RAE.

Thereby, in response to the rise of the RAE signal, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X0.

On the other hand, corresponding to the column addresses Y00, Y01, Y02 and Y03, the column decoder 1 activates the column selector 2, data amplifiers (DA) 4-1, . . . , and the write column select signal WCS. The column selector 2 selects data latches 3-1, . . . , in response to the column select signal CS supplied from the column decoder 1 and connects to the column input/output line (I/O). Also, data D00, D01, D02, D03 for the first write cycle sequentially input via the I/O line is latched parallel in the latches selected by the column selector 2. Then, the data stored in the latches is written into corresponding memory cells via the data amplifiers and via the write/read circuits 5-1, . . . corresponding to the Y addresses Y00, Y01, Y02, Y03. Also, the RAED signal is raised after a time period determined by the delay circuit 191, from the rise of the RAE signal.

In response to the fall of the external control signal DCS (or the chip select signal), the write/read operation start signal ICS (or internal chip select) falls, and, after a time delay determined by the delay circuit 151, the write end signal WEND is generated. In response to the generation of the write end signal WEND, in the timing generating circuit 19, the word line activation signal RAE (or row address enable signal) becomes low and thereby the potential of the word line WL is lowered. After a time period determined by the delay circuit 191 from the fall of the RAE signal, the RAED signal falls and, thereby, the RAE signal again rises and also the ICS signal rises. In this case, from the time the signal RAE becomes low and the word line potential becomes low to the time the RAE signal again becomes high, the precharge bit line signal PBL shown in FIG. 1 is activated and precharge of the bit lines BL and *BL is performed. Also, the data lines DL and *DL are precharged by the data amplifiers DA. Because of such precharge operation of the bit lines and the data lines, it becomes possible to begin the next write cycle quickly.

In the next write cycle, as an X address, i.e., a row address, an external address XADD corresponding to X1 is provided to the memory device, and, as Y addresses, i.e., column addresses, external addresses YADD corresponding to addresses Y10, Y11, Y12 and Y13 are provided to the memory device.

The RAE signal again rises and, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X1.

On the other hand, corresponding to the column addresses Y10, Y11, Y12 and Y13, the column decoder 1 activates the column selector 2, data amplifiers (DA) 4-1, . . . , and the write column select signal WCS. The column selector 2 selects data latches 3-1, . . . , in response to the column select signal CS supplied from the column decoder 1 and connects to the column input/output line (I/O). Also, data D10, D11, D12, D13 for the next write cycle sequentially input via the I/O line is latched parallel in the latches selected by the column selector 2. Then, the data stored in the latches is written into corresponding memory cells via the data amplifiers and via the write/read circuits 5-1, . . . corresponding to the Y addresses Y10, Y11, Y12, Y13.

At the end of the write cycle, the DWR signal (or data write command signal) becomes high. In the word line drive signal generating circuit 10A, the write/read mode signal IWR becomes high and the reset signal generating circuit 15 generates the WEND signal indicating the end of write operation. Therefore, the RAE signal from the timing generating circuit 19 becomes low, and the potential of the word line is lowered so that the RAED signal also falls. Thereby, the write operation finishes.

Next, with reference to FIG. 1, FIGS. 6A through 6D, FIGS. 7A through 7C, and FIG. 9, an explanation will be made on a read operation of the semiconductor memory device according to the second embodiment.

As an example, assume that two read cycles are continuously performed according to the present invention. In the first read cycle, as an X address, i.e., a row address, an external address XADD corresponding to X0 is provided to the memory device, and, as Y addresses, i.e., column addresses, external addresses YADD corresponding to addresses Y00, Y01, Y02 and Y03 are provided to the memory device.

In the word line drive signal generating circuit 10A, the external control signal DWR, that is, a data write command signal, supplied from an external control portion not shown in the drawing is high, indicating read operation. Therefore, the write/read mode signal IWR outputted from the DWR buffer 12 becomes logically high and indicates read operation. In this condition, the DCS buffer 11 outputs the write/read start signal ICS (or internal chip select signal) having low potential level based on the external control signal DCS (or chip select signal) which indicates start of the write/read operation. The ICS signal is supplied to the timing generating circuit 19. In response to the fall of the ICS signal, the timing generating circuit 19 outputs the word line activation signal RAE having logically high potential level.

Thereby, in response to the rise of the RAE signal, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X0.

On the other hand, corresponding to the column addresses Y00, Y01, Y02 and Y03, the column decoder 1 activates the column selector 2 and data amplifiers (DA) 4-1, . . . , Also, data D00, D01, D02, D03 for the first read cycle read out from the corresponding memory cells are latched parallel in the latches selected by the column selector 2, via the write/read circuits 5-1, . . . and via the data amplifiers corresponding to the Y addresses Y00, Y01, Y02, Y03. The data stored in the latches are sequentially outputted to the input/output (I/O) line as the data DQ, via the column selector 2, after the clock cycles corresponding to a predetermined latency.

At the same time, in the reset signal generating circuit 15 of the word line drive signal generating circuit 10A, after a predetermined time period determined by the delay circuit 153 from the rise of the RAE signal, the read end signal REND is generated. In response to the generation of the read end signal REND, in the timing generating circuit 19, the RAE signal becomes low and, after the delay time determined by the delay circuit 191, the RAED signal becomes low. In this case, in response to the fall of the RAE signal, the potential of the word line WL is lowered. From the time the signal RAE becomes low and the word line potential becomes low to the time the RAE signal again becomes high, the precharge bit line signal PBL shown in FIG. 1 is activated and precharge of the bit lines BL and *BL is performed. Also, the data lines DL and *DL are precharged by the data amplifiers DA. Because of such precharge operation of the bit lines and the data lines, it becomes possible to begin the next read cycle quickly.

In the next read cycle, as an X address, i.e., a row address, an external address XADD corresponding to X1 is provided to the memory device, and, as Y addresses, i.e., column addresses, external addresses YADD corresponding to addresses Y10, Y11, Y12 and Y13 are provided to the memory device.

The RAE signal again rises and, in the address latch 14, the internal X address IXA is generated by latching the internal address IA corresponding to the external address XADD. The internal X address IXA is supplied via the predecoder 17 to the XDEC 18 and decoded, thereby a word line drive signal is generated to drive a selected word line WL corresponding to the address X1.

On the other hand, corresponding to the column addresses Y10, Y11, Y12 and Y13, the column decoder 1 activates the column selector 2 and data amplifiers (DA) 4-1, . . . , Also, data D10, D11, D12, D13 for the next read cycle read out from the corresponding memory cells are latched parallel in the latches selected by the column selector 2, via the write/read circuits 5-1, . . . and via the data amplifiers corresponding to the Y addresses Y10, Y11, Y12, Y13. The data stored in the latches are sequentially outputted to the input/output (I/O) line as the data DQ, via the column selector 2, after the clock cycles corresponding to a predetermined latency. Also, after the signal RAE becomes low, the bit lines BL and *BL and the data lines DL and *DL are precharged in a manner similar to the first read cycle.

As mentioned above, in the semiconductor memory device according to the second embodiment, in a write cycle, after a time required for the precharge operation has elapsed from the time when data stored in the data latches is written into memory cells, the next write cycle begins. Also, in a read cycle, after data is read out into the data latches and precharge operation is performed, the next read cycle begins. Therefore, when write cycles or read cycles continue, it is possible to continuously perform write or read operation, in a manner similar to the first embodiment.

Also, in the second embodiment, in the first write or read cycle, the RAE signal is soon raised in response to the generation of the DCS signal in the timing generating circuit 19, without performing logical operation by using the IWR signal as done in the timing generating circuit 16 of first embodiment. Therefore, the word line is activated quickly, and it is possible to shorten an access time in the write or read operation.

As mentioned above, in a memory device in which data is read from and/or written to memory cells via write/read circuits corresponding to selected word lines and bit lines, data latches are connected between a column selector, which distributes data to bit lines or delivers data from the bit lines to an I/O line, and data lines which couple to the write/read circuits, and the data latches temporarily store data to be written or read as a burst or continuously. Also, in a write mode, after a time required for the precharge operation has elapsed from the time when data stored in the data latches is written into memory cells, the next write cycle begins. In a read mode, after data is read out into the data latches and precharge operation is performed, the next read cycle begins. Therefore, when write cycles or read cycles continue, it is possible to continuously perform write or read operation.

Also, in the first write or read cycle, a word line activation signal can be soon activated in response to generation of a write/read operation start signal. Therefore, the word line is activated quickly, and it is possible to shorten an access time in the write or read operation.

In the foregoing specification, the invention has been described with reference to specific embodiments. However, one of ordinary skill in the art appreciates that various modifications and changes can be made without departing from the scope of the present invention as set forth in the claims below. For example, in the memory device according to the first embodiment, the delay circuit 161 can be omitted, by appropriately determining the timing relation between the ICS signal and the IWR signal. Also, the present invention is applicable when continuous read or write operation is to be performed in the same bank of an SDRAM device. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor memory device in which a word line is selected based on a row address, and a bit line is selected based on a column address, and in which, in each write or read cycle, a plurality bits of data are written to or read from memory cells as a burst, said semiconductor memory device comprising:

a plurality of write/read circuits for reading data from selected memory cells to data lines and writing data from said data lines to selected memory cells;

a column selector for distributing data from an input/output line to said data lines, and outputting data from said data lines to said input/output line;

a plurality of data latches inserted into data line circuit portions between said column selector and said write/read circuits, for temporarily storing data to be written to or read from said memory cells as a burst; and wherein, in a write cycle, after data stored in said latches is written into memory cells and after elapsing a predetermined time period required for a precharge operation of said bit lines, the next write cycle is started, and, in a read cycle, after data is read out from memory cells into said data latches and after performing a precharge operation of said bit lines, the next read cycle is started.

2. A semiconductor memory device in which a word line is selected based on a row address, and a bit line is selected based on a column address, and in which, in each write or read cycle, a plurality of data bits are written to or read from memory cells corresponding to a selected word line as a burst, said semiconductor memory device comprising:

a plurality of write/read circuits for reading data from selected memory cells to said lines and writing data from said data lines to said memory cells;

a column selector for distributing data from an input/output line to said data lines, and outputting data from said data lines to said input/output line;

a plurality of data latches inserted into data line circuit portions between said column selector and said write/read circuits, for temporarily storing data to be written to or read from said memory cells as a burst; and a word line drive signal generating circuit which supplies a word line drive signal to said word line, and in which, in a write cycle, said word line drive signal is deactivated after a predetermined delay time corresponding to a time period required for finishing write operation of data stored in said latches from activation of a write/read operation start signal, and said word line drive signal is activated after a predetermined delay time required for the precharge of said bit lines from the time said word line signal is deactivated, and, in a read cycle, after a predetermined delay time from activation of a word line in response to the activation of a write/read operation start signal, said word line drive signal is deactivated and a precharge operation of said bit lines is performed.

3. A semiconductor memory device as set forth in claim 2, wherein, in said word line drive signal generating circuit, a write end signal is generated after a predetermined delay time corresponding to a time until the end of write operation of data to said data latch in response to the generation of said write/read operation start signal, and a read end signal is generated after a predetermined delay time corresponding to a time until the end of read operation of data from said latch in response to the generation of a word line activation signal, and wherein, in a write mode, a word line activation signal is activated after a predetermined delay time corresponding to a sum of a time until the end of write operation of data stored in said latch from the generation of said write/read operation start signal and a time required for the precharge of bit lines, and, in a read mode, said word line activation signal is activated in response to the generation of said write/read operation start signal and said word line activation signal is deactivated when said write end signal or said read end signal is generated.

4. A semiconductor memory device as set forth in claim 3, wherein, in said word line drive signal generating circuit, in the last write cycle, said write end signal is generated after a predetermined delay time corresponding to a time until the end of data write operation to said data latch, in response to the end of said write mode.

5. A semiconductor memory device as set forth in claim 3, wherein, in said word line drive signal generating circuit, said word line activation signal is activated after a predetermined delay time from the generation of said write/read operation start signal.

6. A semiconductor memory device as set forth in claim 2, wherein each of said write/read circuits is coupled to and corresponds to a pair of bit lines.

7. A semiconductor memory device as set forth in claim 2, wherein a plurality of said write/read circuits are coupled to a pair of data lines.

8. A semiconductor memory device as set forth in claim 2, wherein a data amplifier is coupled to a pair of said data lines, and each of said data latches is coupled between said data amplifier and said column selector.

9. A semiconductor memory device as set forth in claim 2, wherein each of said write/read circuits comprises a sense amplifier, a read switch circuit portion for transferring data from a pair of bit lines to a pair of data lines, a write switch circuit portion for transferring data from a pair of data lines to a pair of bit lines, and a precharge circuit portion for precharging a pair of bit lines.

10. A semiconductor memory device in which a word line is selected based on a row address, and a bit line is selected based on a column address, and in which, in each write or read cycle, a plurality of data bits are written to or read from memory cells corresponding to a selected word line as a burst, said semiconductor memory device comprising:

a plurality of write/read circuits for reading data from said memory cells to said data lines and writing data from said data lines to said memory cells;

a column selector for distributing data from an input/output line to said data lines, and outputting data from said data lines to said input/output line;

a plurality of data latches inserted between said column selector and said write/read circuits, for temporarily storing data to be written to or read from said memory cells as a burst; and a word line drive signal generating circuit which, when write cycles or read cycles continue, after a word line drive signal is deactivated in response to the generation of a write end signal or read end signal, said word line drive signal is activated after a predetermined delay time corresponding to a time period required for the precharge of bit lines, and, in the first write or read cycle, said word line drive signal is activated immediately after the generation of said write/read operation start signal.

11. A semiconductor memory device as set forth in claim 10, wherein, in said word line drive signal generating circuit, a write end signal is generated after a predetermined delay time corresponding to a time until the end of write operation of data to said data latch in response to the generation of said write/read operation start signal, and a read end signal is generated after a predetermined delay time corresponding to a time until the end of read operation of data from said latch in response to the generation of a word line activation signal, and wherein, said word line activation signal is activated in response to the generation of said write/read operation start signal, and, said word line activation signal is deactivated in response to the generation of said write end signal or said read end signal, and wherein said word line activation signal is activated again after a predetermined delay time corresponding to a time period required for the precharge of bit lines form the time said word line activation signal is deactivated.

12. A semiconductor memory device as set forth in claim 11, wherein, in said word line drive signal generating circuit, in the last write cycle, said write end signal is generated after a predetermined delay time corresponding to a time until the end of data write operation to said data latch, in response to the end of said write mode.

13. A semiconductor memory device as set forth in claim 10, wherein each of said write/read circuits is coupled to and corresponds to a pair of bit lines.

14. A semiconductor memory device as set forth in claim 10, wherein a plurality of said write/read circuits are coupled to a pair of data lines.

15. A semiconductor memory device as set forth in claim 10, wherein a data amplifier is coupled to a pair of said data lines, and each of said data latches is coupled between said data amplifier and said column selector.

16. A semiconductor memory device as set forth in claim 10, wherein each of said write/read circuits comprises a sense amplifier, a read switch circuit portion for transferring data from a pair of bit lines to a pair of data lines, a write switch circuit portion for transferring data from a pair of data lines to a pair of bit lines, and a precharge circuit portion for precharging a pair of bit lines.

17. A semiconductor memory as set forth in claim 1, wherein the next write cycle is started after said data lines are precharged while a word line is in a deactivated state, and wherein the next read cycle is started after said data lines are precharged.

* * * * *